(12) United States Patent
Thiessen

(10) Patent No.: US 11,118,602 B2
(45) Date of Patent: Sep. 14, 2021

(54) ADAPTABLE THIN SECTION LIQUID PUMP FOR ELECTRONICS COOLING SYSTEMS OR OTHER SYSTEMS

(71) Applicant: Raytheon Company, Waltham, MA (US)

(72) Inventor: Phillip W. Thiessen, Wellesley, MA (US)

(73) Assignee: Raytheon Company, Waltham, MA (US)

( * ) Notice: Subject to any disclaimer, the term of this patent is extended or adjusted under 35 U.S.C. 154(b) by 439 days.

(21) Appl. No.: 15/863,200

(22) Filed: Jan. 5, 2018

(65) Prior Publication Data

US 2018/0199466 A1  Jul. 12, 2018

Related U.S. Application Data

(60) Provisional application No. 62/443,295, filed on Jan. 6, 2017.

(51) Int. Cl.
| | |
|---|---|
| *F04D 29/58* | (2006.01) |
| *F04D 29/42* | (2006.01) |
| *F04D 29/62* | (2006.01) |
| *F04D 13/02* | (2006.01) |
| *H05K 7/20* | (2006.01) |
| *F04D 13/06* | (2006.01) |
| *F04D 1/00* | (2006.01) |
| *F04D 29/24* | (2006.01) |

(52) U.S. Cl.
CPC ......... *F04D 29/586* (2013.01); *F04D 13/024* (2013.01); *F04D 29/426* (2013.01); *F04D 29/588* (2013.01); *F04D 29/628* (2013.01); *F04D 1/00* (2013.01); *F04D 13/06* (2013.01); *F04D 13/0666* (2013.01); *F04D 29/242* (2013.01); *H05K 7/20254* (2013.01); *H05K 7/20272* (2013.01)

(58) Field of Classification Search
CPC ........ F04D 5/002; F04D 13/027; F04D 13/06; F04D 13/064; F04D 13/0606; F04D 13/0666; F04D 29/426; F04D 29/586; F04D 29/588; F04D 29/5806; F04D 29/5813; F04D 25/0653; F04D 29/628; H05K 7/20254
See application file for complete search history.

(56) References Cited

U.S. PATENT DOCUMENTS

| | | | |
|---|---|---|---|
| 6,986,648 B2 * | 1/2006 | Williams | .............. F04D 13/064 417/370 |
| 7,217,086 B2 * | 5/2007 | Seko | ....................... F04D 5/002 415/177 |

(Continued)

FOREIGN PATENT DOCUMENTS

| | | |
|---|---|---|
| DE | 102016109021 A1 | 11/2016 |
| EP | 2554191 A1 | 2/2013 |

OTHER PUBLICATIONS

International Search Report and Written Opinion of the International Searching Authority in counterpart PCT Patent Application No. PCT/US2018/012548 dated Apr. 20, 2018, 14 pages.

*Primary Examiner* — Peter J Bertheaud

(57) ABSTRACT

A pump includes a circular housing having a thin profile, a brushless open frame motor, and a centrifugal impeller. The pump is configured to transport a fluid to transfer thermal energy to or from one or more external components.

20 Claims, 9 Drawing Sheets

(56) References Cited

U.S. PATENT DOCUMENTS

| | | | | |
|---|---|---|---|---|
| 7,312,986 | B2* | 12/2007 | Tomioka | G06F 1/203 |
| | | | | 165/80.2 |
| 7,729,118 | B2 | 6/2010 | Lai et al. | |
| 7,905,712 | B2* | 3/2011 | Huang | F04D 29/586 |
| | | | | 417/423.7 |
| 8,013,484 | B2* | 9/2011 | Yang | F04D 13/0606 |
| | | | | 310/59 |
| 9,145,899 | B2* | 9/2015 | Yokozawa | F04D 5/006 |
| 2005/0226745 | A1* | 10/2005 | Seko | F04D 5/002 |
| | | | | 417/423.14 |
| 2007/0110592 | A1 | 5/2007 | Liu et al. | |
| 2008/0289803 | A1 | 11/2008 | Yang et al. | |
| 2009/0169399 | A1* | 7/2009 | Wu | F04B 19/006 |
| | | | | 417/354 |
| 2016/0341202 | A1 | 11/2016 | Chai et al. | |

\* cited by examiner

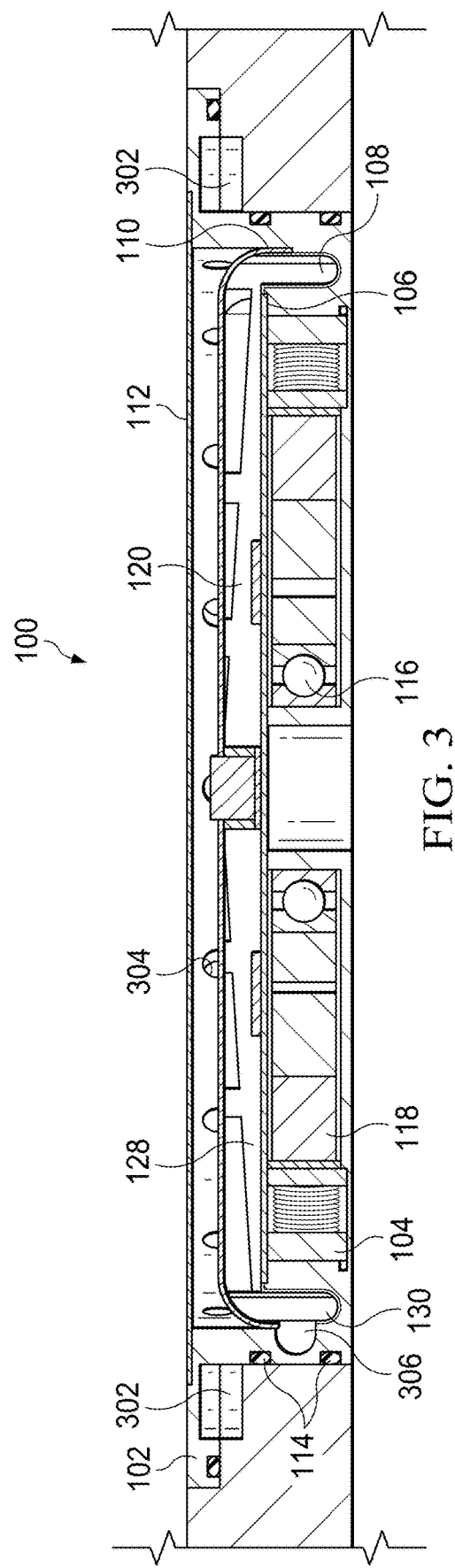

ADAPTABLE THIN SECTION LIQUID PUMP FOR ELECTRONICS COOLING SYSTEMS OR OTHER SYSTEMS

CROSS-REFERENCE TO RELATED APPLICATION AND PRIORITY CLAIM

This application claims priority under 35 U.S.C. § 119(e) to U.S. Provisional Patent Application No. 62/443,295 filed on Jan. 6, 2017, which is hereby incorporated by reference in its entirety.

TECHNICAL FIELD

This disclosure is generally directed to electronics cooling systems. More specifically, this disclosure is directed to an adaptable thin section liquid pump for electronics cooling systems or other systems.

BACKGROUND

In many industries, including commercial and military radio frequency (RF) and electronics industries, a method to minimize junction temperatures and ensure system reliability includes liquid cooling directly in thermal contact with a mounting base of active electronic components to be cooled. Miniature brushless motor pumps designed to be mounted directly on circuit card assembly (CCA) heat producing components, such as computer processors, are available from multiple sources. However, these are not typically capable of being integrated internally into thin structures and providing volume flow rates and pressures that a large-diameter torque motor can produce. Thermal conduction paths that use dry contact clamping, such as wedge locks, also typically compromise thermal designs.

SUMMARY

This disclosure provides an adaptable thin section liquid pump for electronics cooling systems or other systems.

In a first embodiment, a pump includes a circular housing having a thin profile, a brushless open frame motor, and a centrifugal impeller. The pump is configured to transport a fluid to transfer thermal energy to or from one or more external components.

In a second embodiment, a system includes one or more electronic components and a pump. The pump includes a circular housing having a thin profile, a brushless open frame motor, and a centrifugal impeller. The pump is configured to transport coolant in a closed loop to transfer thermal energy away from the one or more electronic components.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which:

FIG. 3 illustrates a cross-sectional view of the fluid pump of FIG. 1 according to this disclosure.

DETAILED DESCRIPTION

Figure 1:
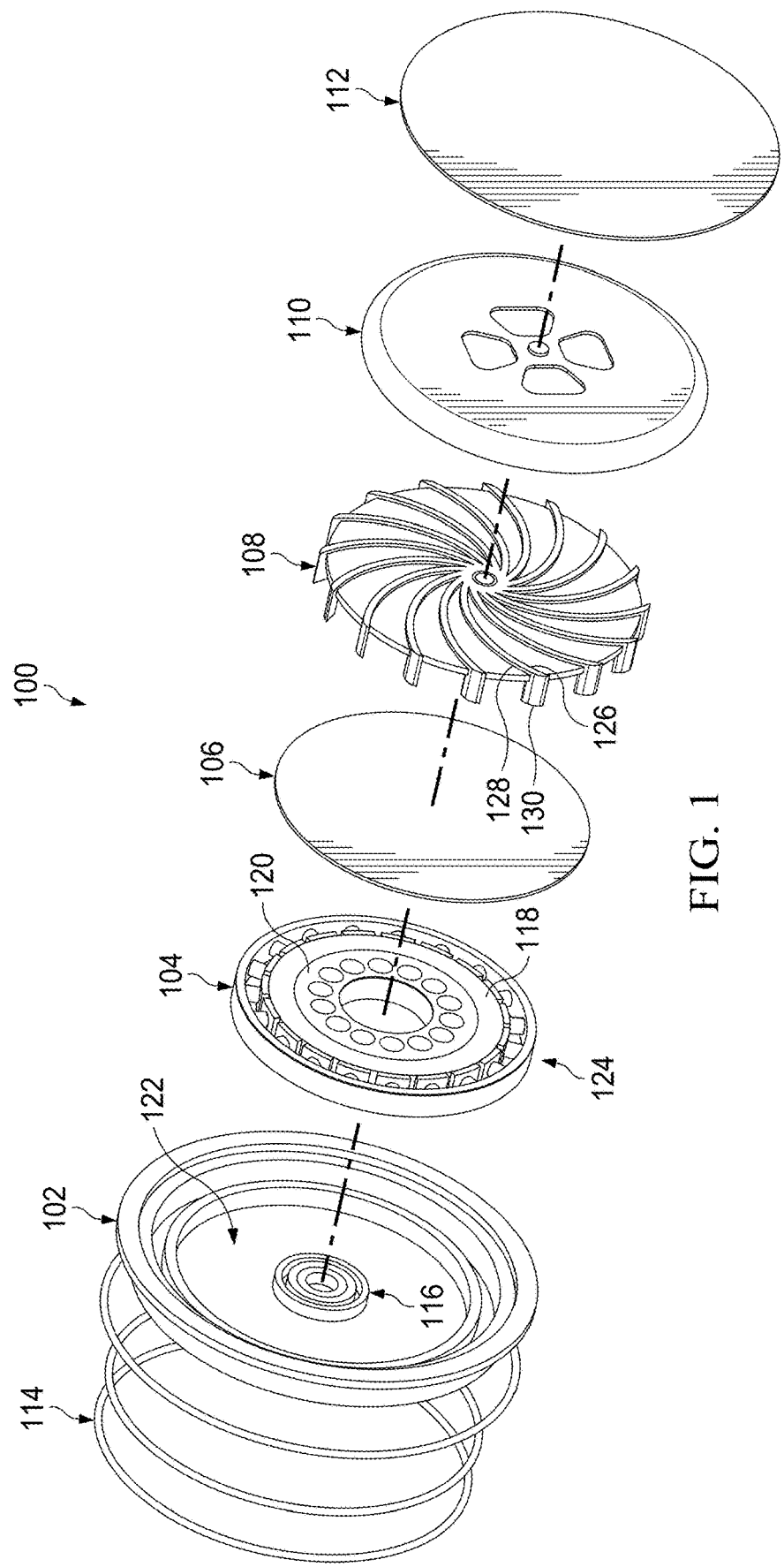
FIG. 1 illustrates an exploded view of an example fluid pump according to this disclosure.

FIGS. 1 through 4, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and is not meant to imply that the feature or component cannot be employed in the embodiments described in connection with that figure.

As noted above, many industries desire a method to minimize junction temperatures and ensure system reliability. Some systems use forced-air cooling, which can be adequate for low thermal loads. However, some heat-generating components, such as RF electronics and microwave arrays, have very high density thermal loads. In such cases, forced-air cooling systems may not support sufficient thermal transfer. To address these and other issues, embodiments of this disclosure provide a scalable, thin-section coolant pump that can be incorporated into various structures, such as distributed line-replaceable unit (LRU) housings and array structures for thermal control of high density RF or other electronics. The disclosed embodiments avoid the use of large-scale plumbing and piping systems.

The disclosed embodiments provide a low cost, thin profile (such as less than 0.5" thick) centrifugal pump providing closed-loop coolant flow at high flow rates (e.g., 1.5-3 gallons/minute) and pressure heads (e.g., 20-50 PSI), which can be suitable for localized thermal control of high-density RF or other electronic components. The pump can be also referred to a "cool puck" due to its cooling function and its similarity in overall size and shape to a hockey puck. A synchronous, brushless open-frame motor (such as with a separate stator and rotor) can be installed in a circular (e.g., >3.5" dia.) housing of the fluid pump with a magnetically-coupled centrifugal impeller achieving maximum flow rate and pressure head. The fluid pump can be easily integrated into electronic structures or housings for heat removal. In some embodiments, the fluid pump can use an open-frame torque motor and magnetic coupling to drive a wrap-around impeller, providing a thin profile cooling system adaptable to many structures.

Some existing open-frame brushless motors are used in various industries, but they are highly integrated into specialized machines, such as in robotics. These types of motors are extremely quiet (such as less than 26 dBA) and highly reliable (such as more than 50,000 hours). Using an open-frame brushless motor to rotate a large-diameter centrifugal impeller-type pump provides for high discharge rates and pressure heads directly under RF or other electronics and power subsystems. Integrating single-motor or dual-motor pumps into structural cold plates and electronics housings can significantly lower junction component temperatures using high-pressure micro-channels and/or high-density fin stocks. Centrifugal pumps can provide lower noise and vibration compared to gear, piston, or diaphragm type pumps.

Liquid transport systems in direct contact with high-power or other components can help to reduce or minimize size and increase or maximize system performance. Developing structures using the disclosed pumps that can be integrated within existing structures can advance and greatly benefit existing power systems, data processing systems, array sensor technologies, or other systems.

In some embodiments, additive manufacturing can be used to generate components of the fluid pump, including the impeller. The disclosed pumps are easily adaptable to multiple types of structures. Among other things, the disclosed pumps enable an increase in RF or other electronic power and component packaging densities.

Additional details regarding embodiments of this disclosure are provided below. Note that while embodiments of this disclosure describe the use of one or more pumps with electronics cooling systems, the pump(s) could be used in any other suitable device or system. Also note that while various embodiments provide specific dimensions for example implementations of the pump(s), these dimensions are examples only, and other dimensions could be used as needed or desired.

FIG. 1 illustrates an exploded view of an example fluid pump 100 according to this disclosure. As shown in FIG. 1, the fluid pump 100 includes a housing 102, a brushless stator 104, a fluid shield 106, an impeller 108, an impeller shield 110, a cover 112, one or more seals 114, a bearing 116, a rotor 118, and a magnetic coupling 120.

The housing 102 houses most of the other components of the fluid pump 100. The housing 102 is generally circular and, in some embodiments, has a diameter of approximately 3.5 inches. The housing 102 includes a recess 122 in which other components are arranged. The housing 102 is low profile, having a depth (in the axial direction) of approximately 0.7 inch or less in some embodiments. In some particular embodiments, the profile depth is 0.5 inch or less. This depth represents most of the thickness of the pump 100 (other than the thickness of the cover 112). Thus, in some embodiments, the diameter of the housing 102 can be at least seven times as large as a thickness of the pump 100. The housing 102 can be formed of a metal, such as anodized aluminum, or of any other suitable material.

The brushless stator 104, the bearing 116, and the rotor 118 form a synchronous, brushless open-frame motor 124 that drives the impeller 108. The brushless stator 104 can be formed of stainless steel or any other suitable material. The bearing 116 can be a ball bearing. The rotor 118 can be a rare earth rotor. In some embodiments, the motor 124 is a synchronous, brushless open-frame motor. The magnetic coupling 120 serves to couple the motor 124 and the impeller 108.

The impeller 108 is a two-stage impeller that includes a plurality of blades 126 that extend radially from a central axis. The blades 126 are two-stage blades that include a planar portion 128 and an axial portion 130. The planar portions 128 of the blades 126 include ridges that project from a planar surface of the impeller 108. In some embodiments, the ridges extend out from the central axis in an arc, as shown in FIG. 1. At the end of the planar portion 128 of each blade 126, the axial portion 130 extends perpendicular to the planar portion 128 (and parallel to the central axis), thereby covering a portion of the motor 124.

Together, the planar portions 128 of the blades 126 generate radial movement of the coolant fluid toward the axial portions 130, while the axial portions 130 result in circumferential movement of the coolant fluid toward one or more fluid outlets (shown in FIG. 3).

Because of the axial portions 130 of the blades 126, the impeller 108 essentially wraps around edges of the motor 124, as more clearly illustrated in FIG. 3. Driven by the motor 124, the impeller 108 rotates, during standard fluid throughput, at 400-600 rpm. In other embodiments, the rotation may be faster or slower, but typically will be less than 1000 rpm. The impeller 108 can be formed of brass, bronze, or another suitable metallic material.

The fluid shield 106 is plastic and protects the motor 124 from the fluid. The impeller shield 110 is disposed closely over the impeller 108 and acts to reduce fluid turbulence in the pump 100. The impeller shield 110 can be formed of stainless steel. The cover 112 covers and protects the components inside the housing 102 and, together with the housing 102, creates a hermetic environment for the coolant to flow through. Like the housing 102, the cover 112 can be formed from a metal, such as anodized aluminum.

The seals 114 extend circumferentially around an exterior surface of the housing 102 and are used to ensure a sealed connection once the fluid pump 100 is installed in a system or device. The seals 114 are formed of elastomers, such as plastic or rubber. In some embodiments, the seals 114 are "O" rings.

While FIG. 1 illustrates one example of the pump 100, various changes may be made to FIG. 1. For example, the example dimensions of the pump 100 described herein are scalable to other values to accommodate different flow volumes and delivery pressures.

FIGS. 2A through 2F illustrate examples of different systems 201-206 that incorporate one or more fluid pumps 100 according to this disclosure. These systems 201-206 illustrate that the fluid pump 100 can provide cooling in many types of applications.

Figure 2A:
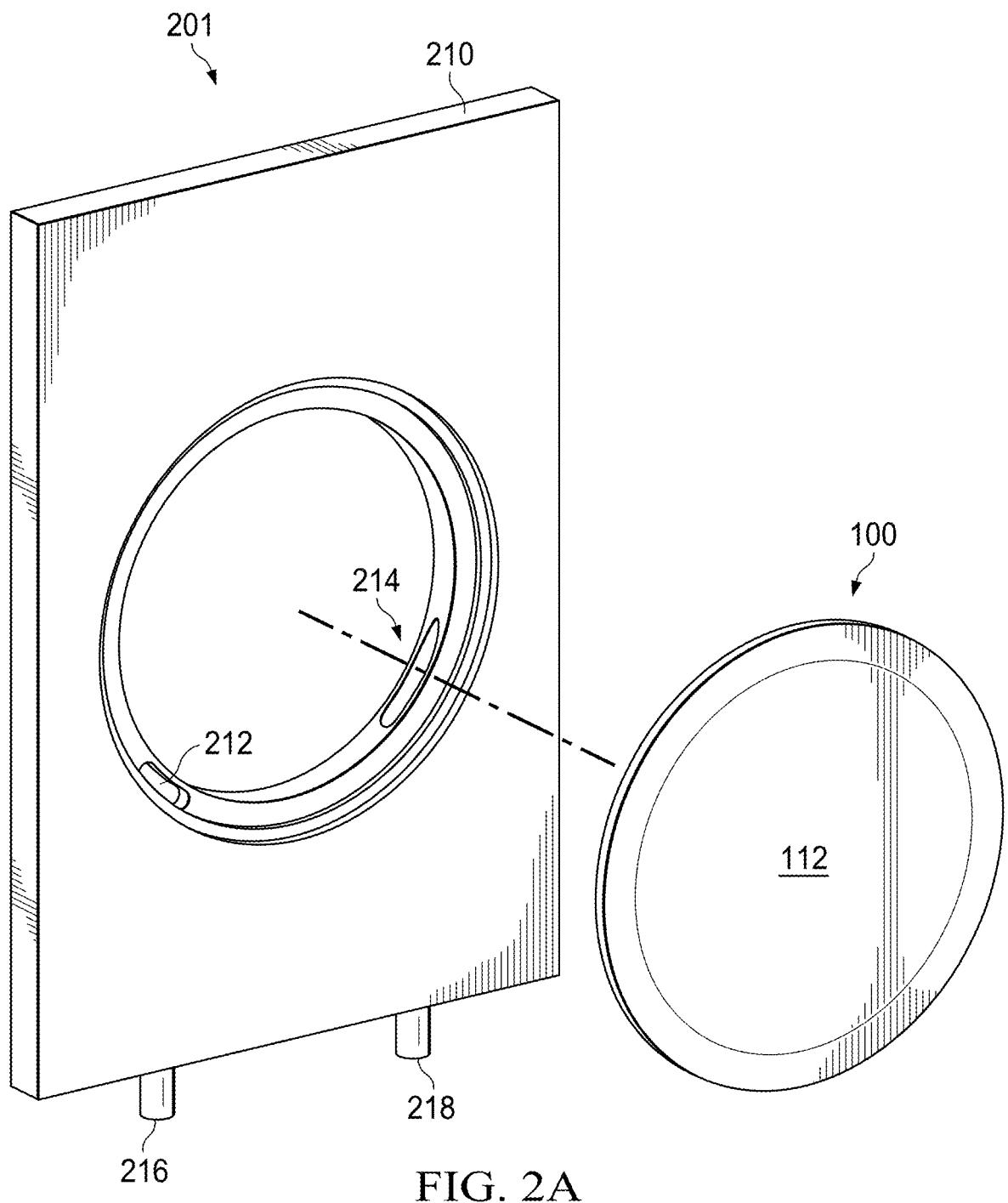
FIGS. 2A through 2F illustrate examples of different systems that incorporate one or more fluid pumps according to this disclosure.

FIG. 2A illustrates a system 201 that includes a fluid pump 100 with a cold plate 210. The cold plate 210 includes one or more pump inlets 212 and one or more pump outlets 214. Each pump inlet 212 is an interface for fluid flowing from the cold plate 210 into the housing 102 of the pump 100. Each pump outlet 214 is an interface for fluid flowing from the pump 100 back into the cold plate 210. The cold plate 210 also includes a fluid inlet 216 and a fluid outlet 218. These may be hydraulically coupled to a radiator, evaporator, or other components (not shown) in a closed-loop cooling system.

The fluid pump 100 can be installed ("plugged") directly into a recess of the cold plate 210, and the seals 114 ensure a sealed connection once the fluid pump 100 is installed. When the pump 100 is installed in the cold plate 210, the pump 100 and cold plate 210 are hydraulically connected. Input and output openings in the pump housing 102 (shown in FIG. 3) align with corresponding ones of the pump inlet(s) 212 and pump outlet(s)) 214. The cold plate 210 can be formed of aluminum or another suitable material. In some embodiments, the cold plate 210 can include a configurable plate adapter that can accommodate different sizes of fluid pumps 100.

In one aspect of operation, operation of the pump 100 causes coolant fluid to flow into the fluid inlet 216, through the pump inlet 212, and into the pump 100. The fluid then moves through the pump 100, out of the pump 100 back into the cold plate through the pump outlet 214, and then out of the cold plate 210 through the fluid outlet 218. The cold plate 210 may have one or more fluid channels (not shown) that allow for the fluid to circulate within portions of the cold plate 210 before and/or after passing through the pump 100. While the fluid is circulating through the pump 100 and the cold plate 210, thermal energy can be transferred through the cover 112 of the pump 100, through exterior surfaces of the cold plate 210, or a combination of these.

Figure 2B:
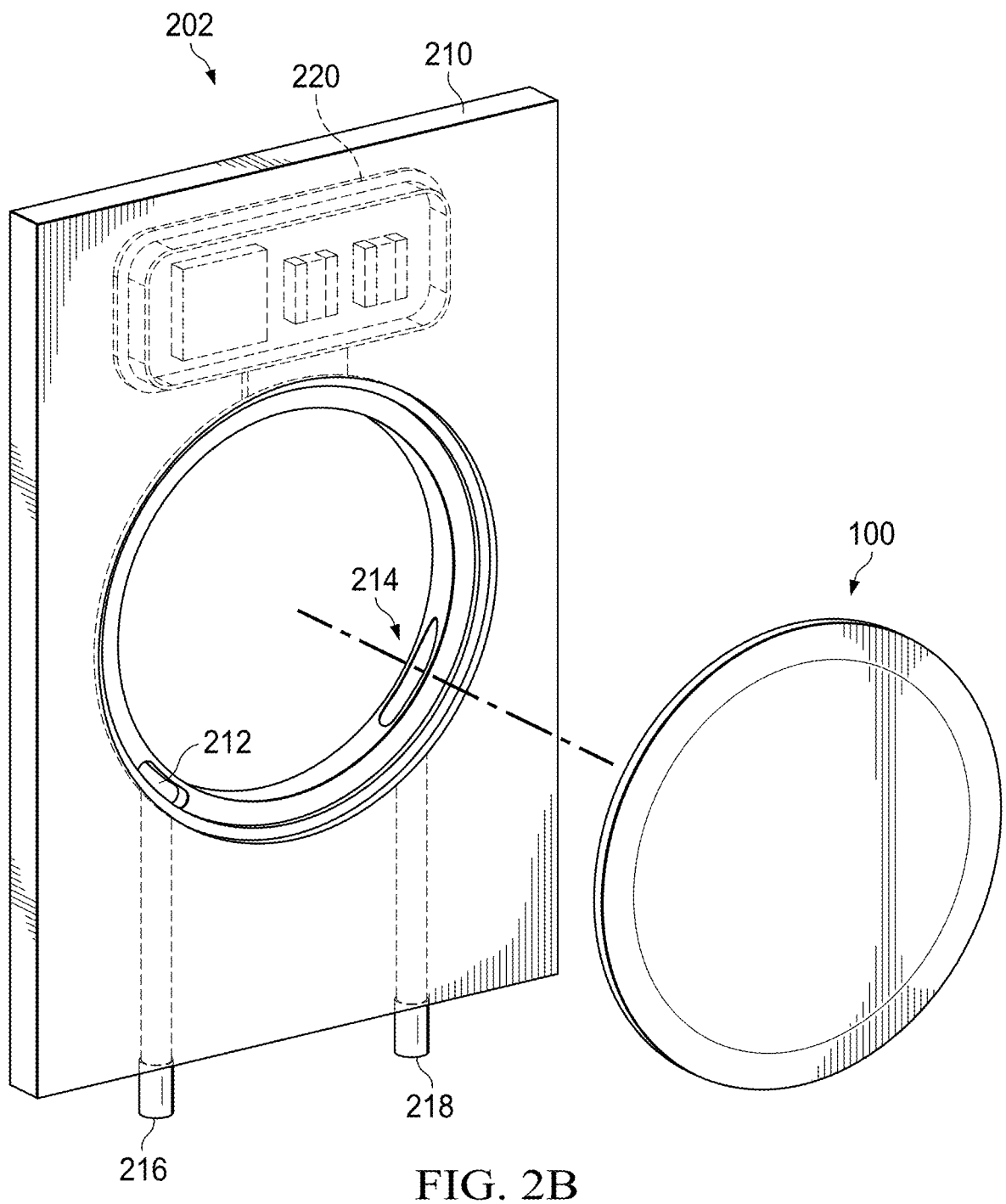

FIG. 2B illustrates a system 202 that is similar to the system 201 of FIG. 2A, and includes a fluid pump 100 and a cold plate 210. The system 202 also includes a controller 220 that controls operation of the pump 100. The controller 220 can be programmable, and can include any suitable combination of hardware, firmware, and software for controlling operation of the pump 100. In some embodiments, the controller 220 is an integrated gate bipolar transistor (IGBT) controller. In some embodiments, the controller 220 also provides power to operate the pump 100.

Figure 2C:
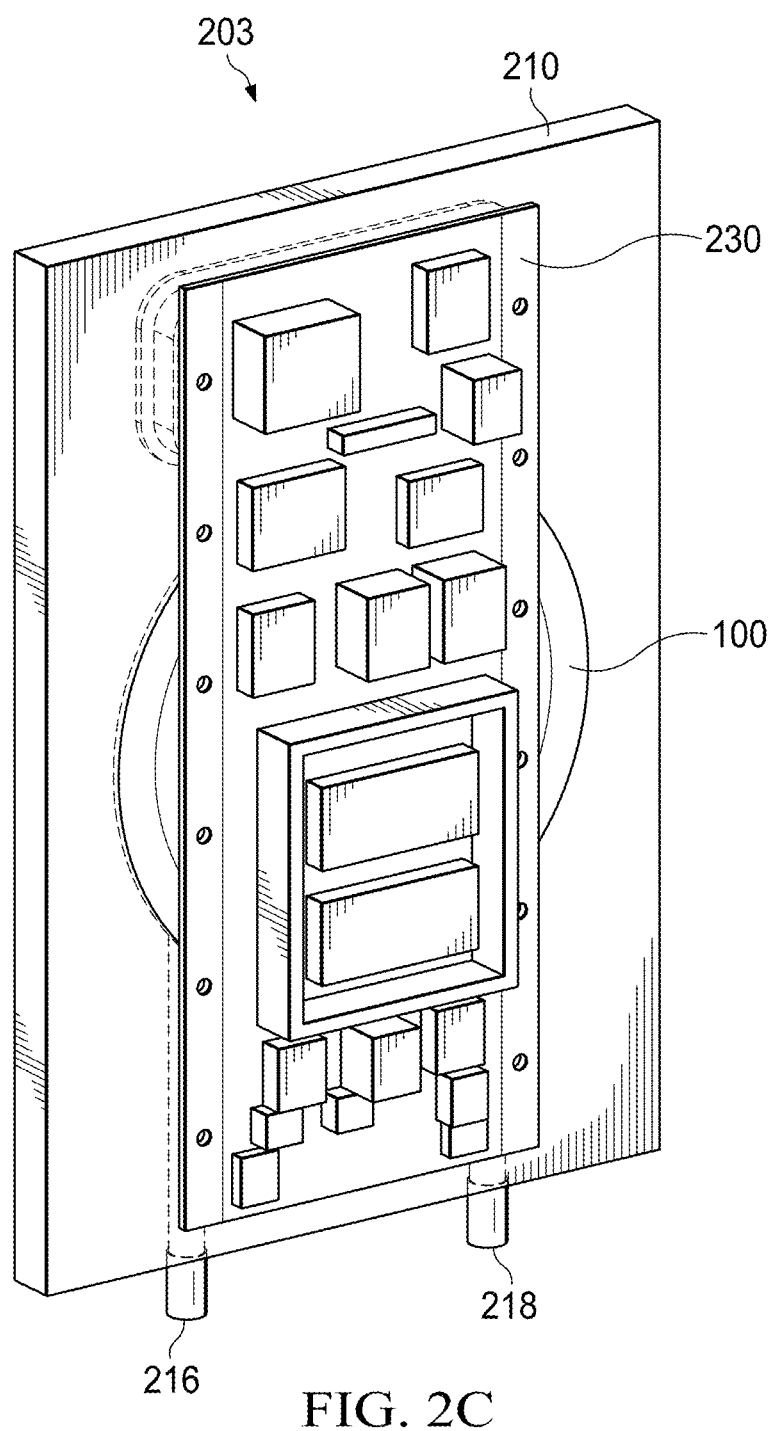
Figure 2D:
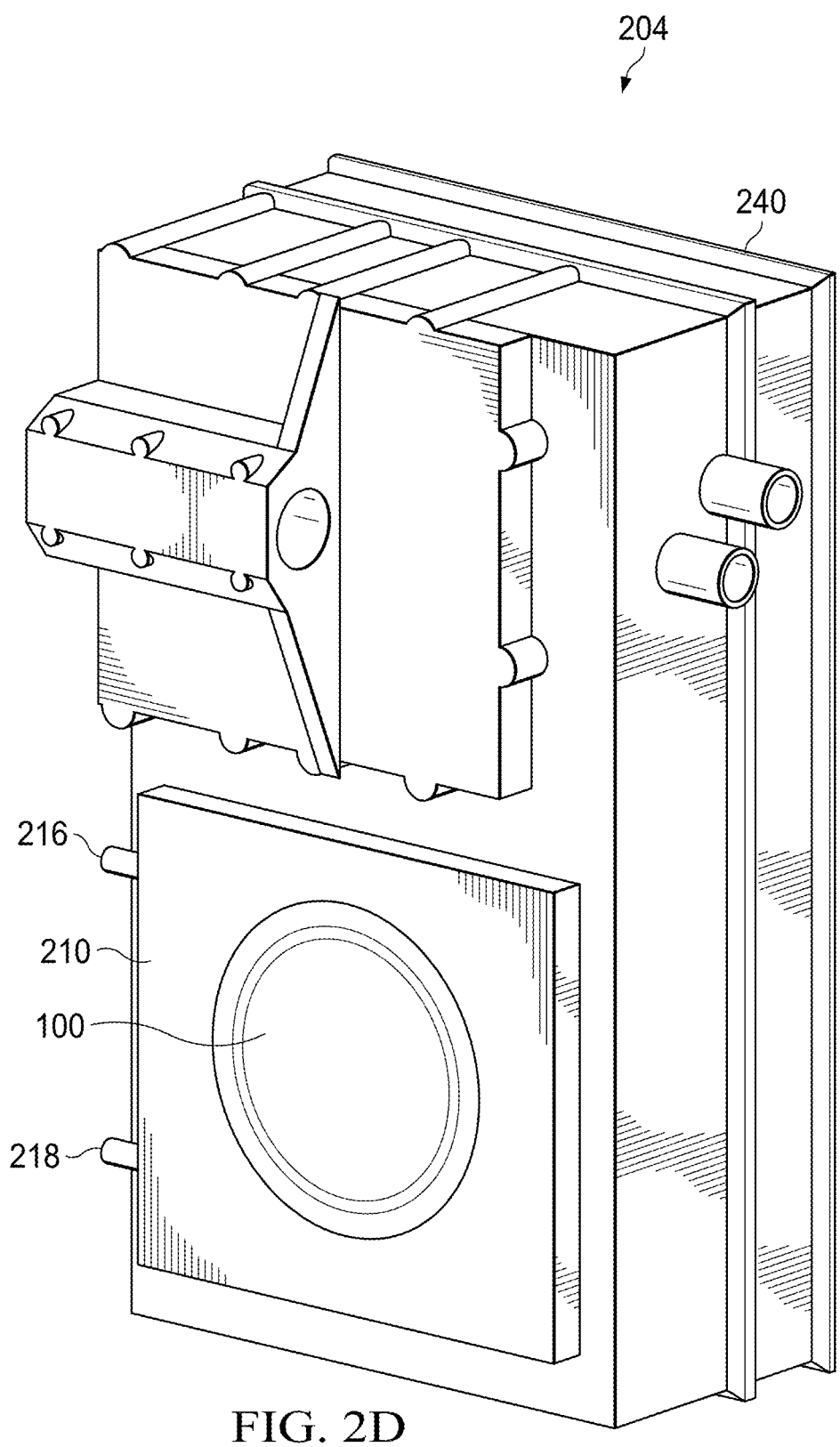
Figure 2E:
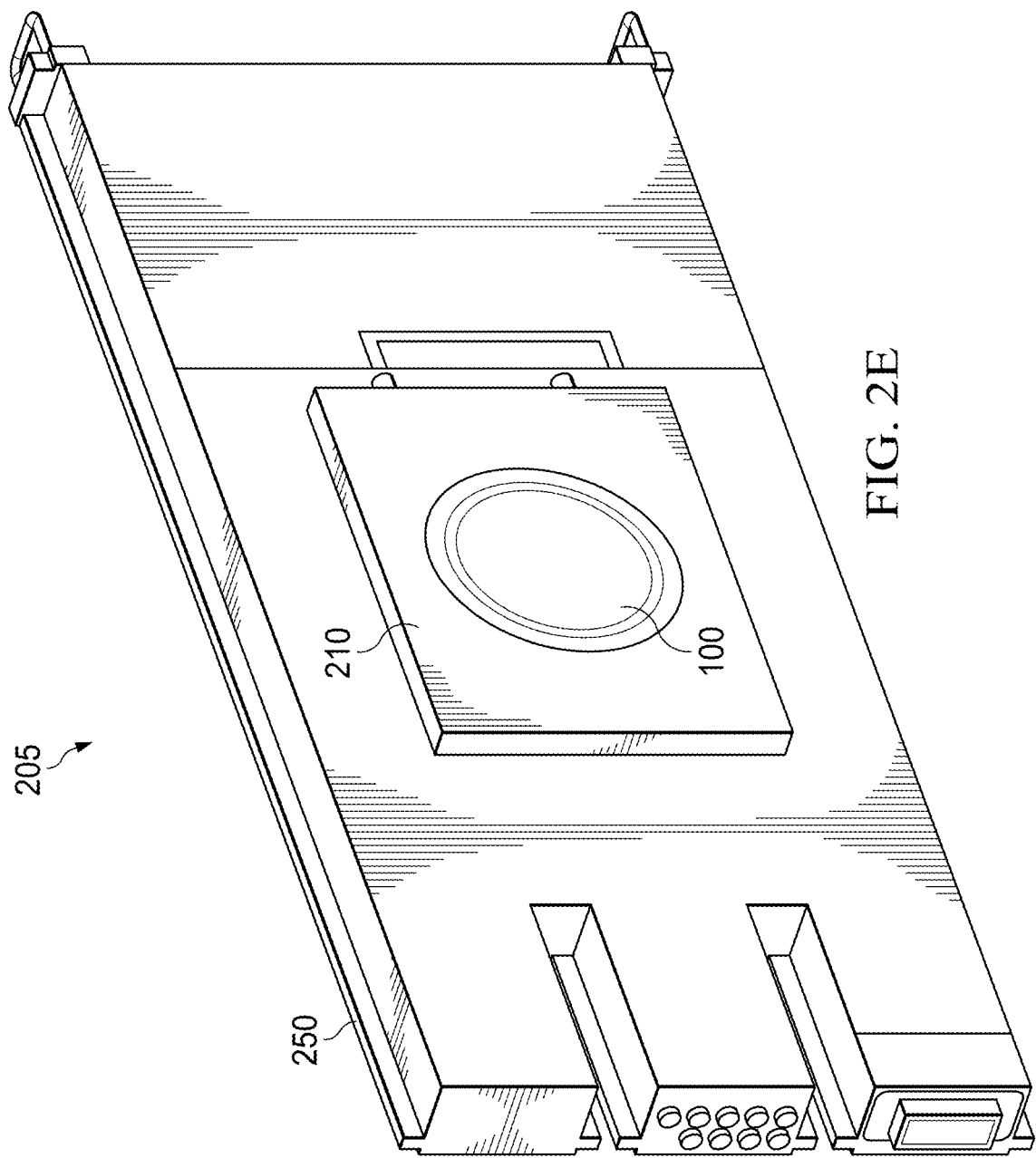

FIG. 2C illustrates a system 203 that is similar to the system 201 of FIG. 2A, and includes a fluid pump 100 and a cold plate 210. The system 203 provides thermal control to a connected power supply component 230, such as a high power DC to DC converter. In one aspect of operation, the power supply component 230 generates waste heat, and the coolant fluid circulating through the fluid pump 100 and cold plate 210 absorb portions of the waste heat, which is conductively transferred through the pump cover 112 and surfaces of the cold plate 217FIGS. 2D and 2E illustrate systems 204-205 that are similar to the system 201 of FIG. 2A, and include a fluid pump 100 and a cold plate 210. Both systems 204-205 provide thermal control to a connected heat-generating component. In FIG. 2D, the heat-generating component is a solid state module 240 of a ultra-high frequency (UHF) phased array antenna. In FIG. 2E, the heat-generating component is a digital receiver exciter (DREX) or synthesizer 250.

Figure 2F:
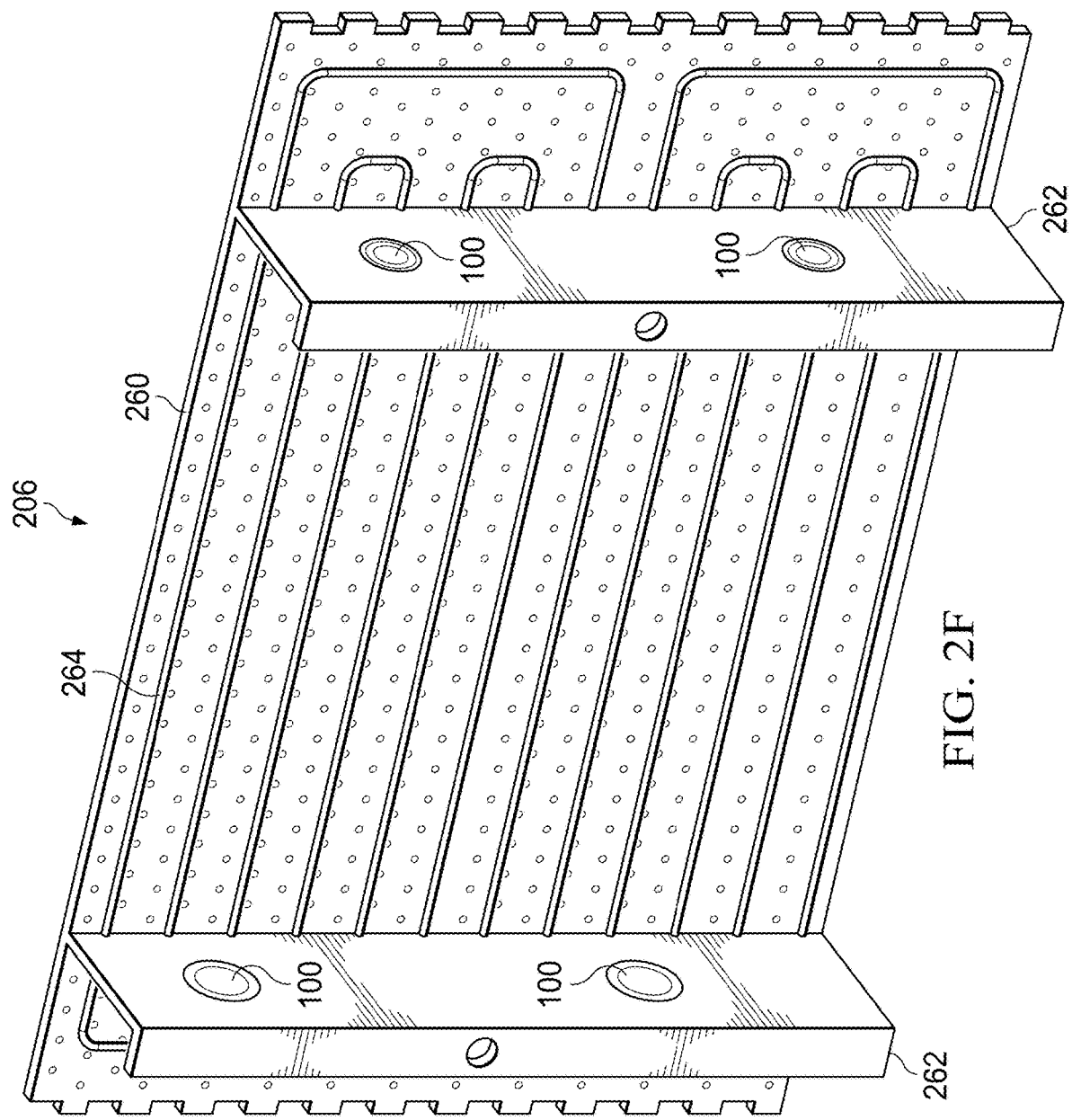

FIG. 2F illustrates a system 206 that includes a heating or cooling array with multiple fluid pumps 100. The system also includes an array plate 260, one or more array plate stiffeners 262, and one or more heating or cooling lines 264. The array plate 260 includes a generally planar surface through which thermal transfer can occur with an object to be heated or cooled. The array plate stiffeners 262 are generally perpendicular to the array plate 260 and help to prevent bending or flexing of the array plate 260. The array plate 260 and array plate stiffeners 262 can be formed of a metal, such as aluminum, or any other suitable material.

The heating or cooling lines 264 are disposed on a back surface of the array plate 260 and are configured to transport heating or coolant fluid for thermal transfer throughout the array plate 260. While various embodiments disclosed herein have been described with coolant for transferring thermal energy away from a heat generating body, it will be understood that these embodiments are also suitable for use with a heating fluid for transferring thermal energy to a cooler body.

The heating or cooling lines 264 are hydraulically connected to the multiple fluid pumps 100, which can operate together in parallel to increase the total fluid flow through the heating or cooling lines 264. The array plate stiffeners 262 could be fitted with openings and adapters (similar to those of the cold plate 210 shown in FIG. 2A) configured to accept a fluid pump 100 and provide a sealed connection once each fluid pump 100 is installed.

FIG. 3 illustrates a cross-sectional view of the fluid pump 100 according to this disclosure. As shown in FIG. 3, the fluid pump 100 includes the housing 102, the stator 104, the fluid shield 106, the centrifugal impeller 108, the impeller shield 110, the cover 112, seals 114, the bearing 116, the rotor 118, and the magnetic coupling 120.

FIG. 3 also shows one or more pump inlets 302 disposed circumferentially around the housing 102. The pump inlets 302 are where low pressure coolant fluid enters the pump 100. Each pump inlet 302 can align with a corresponding pump inlet of a cold plate, such as the pump inlet 212 of FIG. 2A. The fluid then flows from the pump inlet(s) 302 into the cavity around the impeller 108 through one or more orifices 304. The planar portions 128 of the blades 126 generate radial movement of the coolant fluid toward the axial portions 130, while the axial portions 130 result in circumferential movement of the coolant fluid toward one or more pump outlets 306 disposed circumferentially around the housing 102 near the axial portions 130 of the impeller 108. The pump outlets 306 are where high pressure fluid leaves the pump. Each pump outlet 306 can align with a corresponding pump outlet of a cold plate, such as the pump outlet 214 of FIG. 2A.

Figure 4:
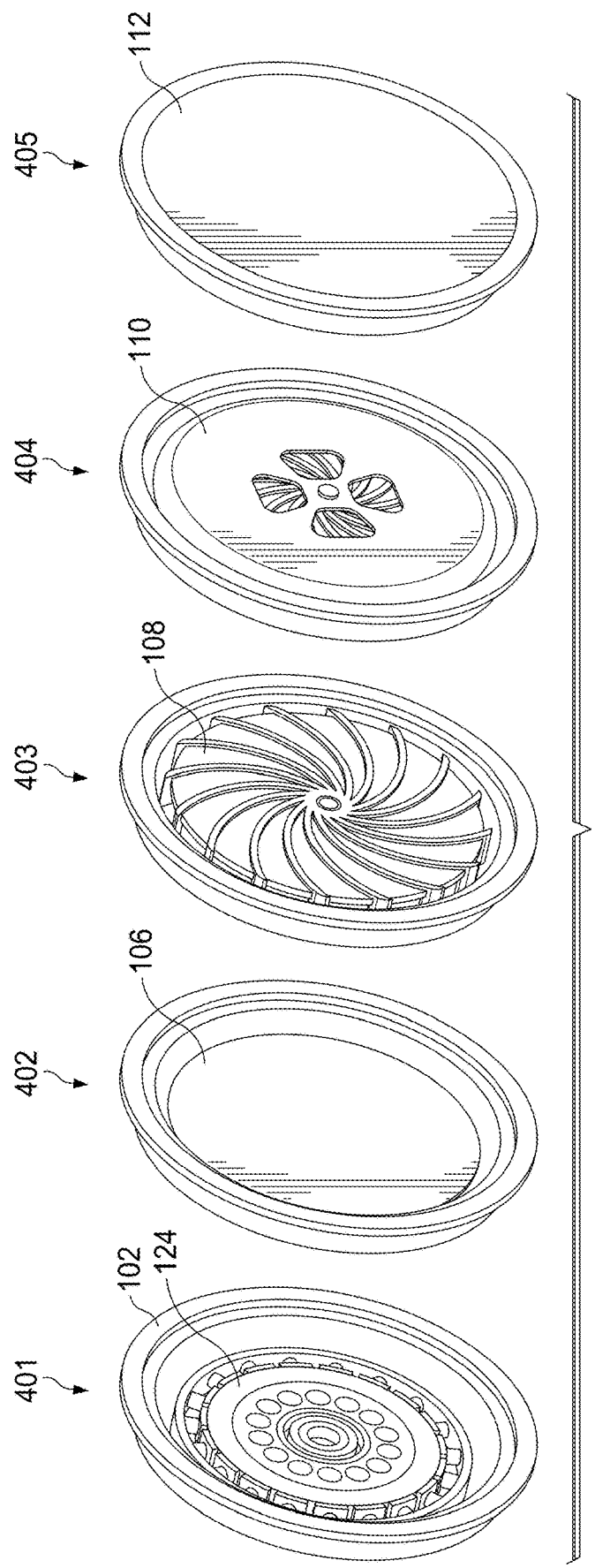
FIG. 4 illustrates an assembly sequence for the fluid pump of FIG. 1 according to this disclosure.

FIG. 4 illustrates an assembly sequence for the fluid pump 100 according to this disclosure. As shown in FIG. 4, operation 401 includes positioning the motor 124 within the recess of the housing 102. At operation 402, the fluid shield 106 is positioned over the motor 124. At operation 403, the impeller 108 is installed over the fluid shield 106. At operation 404, the impeller shield 110 is added over the impeller 108. At operation 405, the cover 112 is installed over and fastened to the housing 102. Any suitable fastening technique can be used to fasten the cover 112 to the housing 102, including adhesives, welding, or fasteners (e.g., screws). Although not specifically shown in FIG. 4, one or more seals 114 can be positioned around a circumferential exterior surface of the housing 102.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in this patent document should not be read as implying that any particular element, step, or function is an essential or critical element that must be included in the claim scope. Also, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," and "system" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the scope of this disclosure, as defined by the following claims.

What is claimed is:

1. An apparatus comprising:
   a cold plate having one or more inlets and one or more outlets; and
   a pump configured to be disposed in or on the cold plate, the pump comprising:
      a circular housing having a thin profile, the circular housing comprising a flange portion that extends radially outward from the circular housing;
      a brushless open frame motor;
      at least one pump inlet disposed on a surface of the flange portion, the at least one pump inlet configured to receive a fluid at a first pressure, wherein each of the at least one pump inlet is configured to align with a corresponding one of the one or more inlets of the cold plate;
      at least one pump outlet configured to output the fluid at a second pressure, wherein each of the at least one pump outlet is configured to align with a corresponding one of the one or more outlets of the cold plate; and
      a centrifugal impeller,
   wherein the pump is configured to transport the fluid to transfer thermal energy to or from one or more external components.

2. The apparatus of claim 1, wherein the circular housing has a thickness of less than 0.5 inches.

3. The apparatus of claim 1, wherein the circular housing has a diameter at least seven times as large as a thickness of the pump.

4. The apparatus of claim 1, wherein the centrifugal impeller comprises a plurality of two-stage blades, each blade comprising a planar portion and an axial portion.

5. The apparatus of claim 4, wherein:
   the planar portion of each blade includes ridges that project from a planar surface of the centrifugal impeller, the planar portions of the blades configured to generate radial movement of the fluid toward the axial portions, and
   the axial portion of each blade extends perpendicular to the planar portion, the axial portions configured to generate circumferential movement of the fluid toward the at least one pump outlet of the pump.

6. The apparatus of claim 1, wherein the second pressure is higher than the first pressure.

7. The apparatus of claim 1, further comprising:
   one or more orifices configured to transport the fluid from the at least one pump inlet of the pump into a cavity around the centrifugal impeller.

8. The apparatus of claim 1, wherein the centrifugal impeller is magnetically coupled to the motor.

9. The apparatus of claim 1, wherein the impeller wraps around edges of the motor.

10. A system comprising:
    one or more electronic components;
    a pump comprising:
       a circular housing having a thin profile, the circular housing comprising a flange portion that extends radially outward from the circular housing;
       a brushless open frame motor;
       at least one pump inlet disposed on a surface of the flange portion, the at least one pump inlet configured to receive a coolant at a first pressure;
       at least one pump outlet configured to output the coolant at a second pressure; and
       a centrifugal impeller; and
    a cold plate configured to receive the pump, the cold plate comprising:
       at least one additional pump inlet each configured to align with a corresponding one of the at least one pump inlet of the pump; and
       at least one additional pump outlet each configured to align with a corresponding pump outlet of the pump,
    wherein the pump is configured to transport the coolant in a closed loop to transfer thermal energy away from the one or more electronic components.

11. The system of claim 10, wherein the circular housing has a thickness of less than 0.5 inches.

12. The system of claim 10, wherein the circular housing has a diameter at least seven times as large as a thickness of the pump.

13. The system of claim 10, wherein the centrifugal impeller comprises a plurality of two-stage blades, each blade comprising a planar portion and an axial portion.

14. The system of claim 13, wherein:
    the planar portion of each blade includes ridges that project from a planar surface of the centrifugal impeller, the planar portions of the blades configured to generate radial movement of the coolant toward the axial portions, and
    the axial portion of each blade extends perpendicular to the planar portion, the axial portions configured to generate circumferential movement of the coolant toward the at least one pump outlet.

15. The system of claim 10, wherein the second pressure is higher than the first pressure.

16. The system of claim 10, further comprising:
    one or more orifices configured to transport the coolant from the at least one pump inlet into a cavity around the centrifugal impeller.

17. The system of claim 10, wherein the centrifugal impeller is magnetically coupled to the motor.

18. The system of claim 10, wherein the impeller wraps around edges of the motor.

19. The system of claim 10, wherein, when the pump is installed in the cold plate, the pump and the cold plate are hydraulically connected.

20. The system of claim 10, wherein at least a portion of the one or more electronic components contacts at least a portion of the cold plate.

* * * * *